United States Patent [19]
O'Callaghan et al.

US005769705A

[11] Patent Number: 5,769,705
[45] Date of Patent: Jun. 23, 1998

[54] THERMOSTATICALLY CONTROLLED ENCLOSURE FOR TEMPERATURE SENSITIVE EQUIPMENT

[75] Inventors: John O'Callaghan, Buchanan County, Mo.; John Nelson, Johnson County, Kans.; Paul G. Mandel; R. Paul McGraw, both of Jackson County, Mo.

[73] Assignee: Alliance Peripheral Systems, Inc., Kansas City, Mo.

[21] Appl. No.: 698,932

[22] Filed: Aug. 16, 1996

[51] Int. Cl.⁶ .................................................. H05K 5/00
[52] U.S. Cl. ............................................. 454/184; 454/73
[58] Field of Search ........................... 454/187; 361/695, 361/687, 697

[56]         References Cited
          U.S. PATENT DOCUMENTS 4,659,290  4/1987  Kundert ..................................... 417/32
5,457,766  10/1995  Ko ............................................ 388/831
5,526,289  6/1996  Ding et al. ............................... 364/557

*Primary Examiner*—Harold Joyce
*Assistant Examiner*—Derek S. Boles
*Attorney, Agent, or Firm*—Hovey, Williams, Timmons & Collins

[57]                ABSTRACT

A thermostatically controlled enclosure for a small computer device includes a housing and a control circuit connected to a temperature signal generator such as a transistor. A circulating fan controlled by the output of the control circuit is mounted to the housing. Also provided is an LED indicator or audible alarm responsive to an over temperature condition within the housing. The control circuit consists of six basic blocks: a temperature to voltage converter; a high current operational amplifier; a fan on/off control; an over temperature sensor network an oscillator; and an LED or alarm driver.

2 Claims, 3 Drawing Sheets

THERMOSTATICALLY CONTROLLED ENCLOSURE FOR TEMPERATURE SENSITIVE EQUIPMENT

TECHNICAL FIELD

The present invention relates to a thermostatically controlled cooled enclosure for temperature sensitive equipment. More specifically, the invention relates to an apparatus and method for controlled cooling of an enclosure for computer equipment, such as personal computers and small computer peripheral devices, with a minimum of noise and power consumption.

BACKGROUND OF THE INVENTION

Computer equipment, including peripheral devices for personal computers such as external storage devices, tend to generate significant amounts of heat during operation. Due to the temperature sensitive nature of the electronic devices used in such equipment, heat generated during operation of the devices is generally deleterious to the operation of such devices when the temperature of the devices exceeds design limits. Depending upon the particular device and design, the performance of electronic devices decreases with increasing temperature and at some threshold level, the device will be subject to thermal shutdown or failure. Consequently, enclosures for small computer devices may, in many instances, require cooling to maintain the temperature inside the enclosure below a specified level.

Conventionally, enclosures for computer equipment, and in particular SCSI (Small Computer System Interface) type devices utilizing temperature-sensitive electronic devices have been equipped with single-speed fans for circulating air through the enclosures for cooling. Such single-speed fans are designed to circulate a fixed volume of air through the enclosure based upon the anticipated heat generation of the devices in the enclosure and an assumed ambient temperature. Thus, such fans typically operate at a fixed speed, regardless of the temperature inside the enclosure. Consequently, a conventional single-speed fan used to cool a computer equipment enclosure may be operating at a higher speed than necessary, depending upon ambient conditions, to provide the required cooling for the enclosure.

Circulating fans however, generate acoustical noise that may be distracting or annoying. Depending upon the design of the particular fan, the amount of noise generated is generally a function of the speed at which the fan is operated. Consequently, a single-speed circulating fan used to cool an enclosure for a computer device will generate a constant volume of acoustical noise, irrespective of the amount of cooling required. Additionally, the power consumption of a single-speed fan used to circulate air through an enclosure for computer devices may also be greater than necessary to provide the required cooling.

Heretofore, conventional systems for cooling enclosures for computer devices, and in particular small computer systems such as personal computers and personal computer peripheral devices, have not been equipped to provide an indication or warning when the temperature inside a particular enclosure approaches a level at which the performance of the device housed in the enclosure may be adversely affected. Thus, the typical personal computer user would not be aware that the temperature inside the enclosure of a particular device was reaching a critical level until the device malfunctioned or shut down. During operations, such a malfunction or failure could result in the loss of data and/or files. Moreover, even after a failure of a device due to excessive temperature, the operator would not necessarily be able to determine the cause of the malfunction or failure and could possibly attribute the failure to a different cause.

Thus, there is a need for an improved enclosure for small computer devices that provides adequate cooling with a minimum amount of noise and power consumption that also provides an indication of an overtemperature condition in the enclosure.

SUMMARY OF THE INVENTION

The present invention provides an improved enclosure for small computer devices that provides adequate cooling with a minimum amount of noise and power consumption. In another embodiment, the present invention also provides an indication of an overtemperature condition in an enclosure for small computer devices. More particularly, the present invention utilizes a thermistor as part of a control circuit to vary the speed of a circulating fan with temperature to cool an enclosure for a small computer device with a minimum of noise and power consumption.

DETAILED DESCRIPTION

Figure 1:
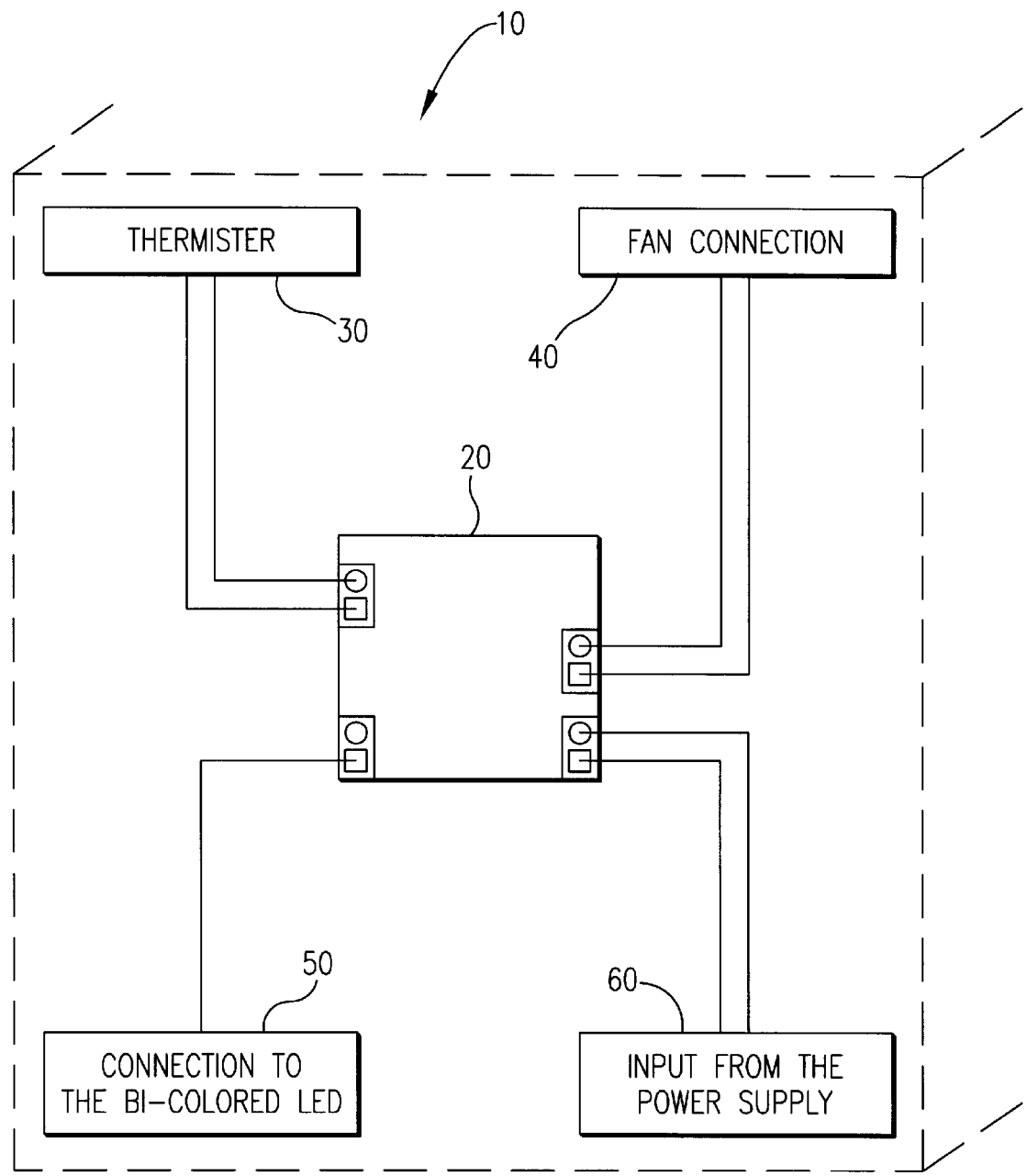
FIG. 1 is a schematic representation of an enclosure for a small computer component or device in accordance with the present invention.

Referring now to FIG. 1, there is illustrated an enclosure 10 suitable for use with a personal computer or SCSI type peripheral device such as an external hard disk drive, optical drive, tape drive or similar device. A circuit board 20 is mounted internally or externally of enclosure 10 and includes connections for a temperature signal generator such as a thermistor 30, a circulating fan 40, an indicator 50 such as an LED or audible alarm and input from a power supply 60.

Figure 2:
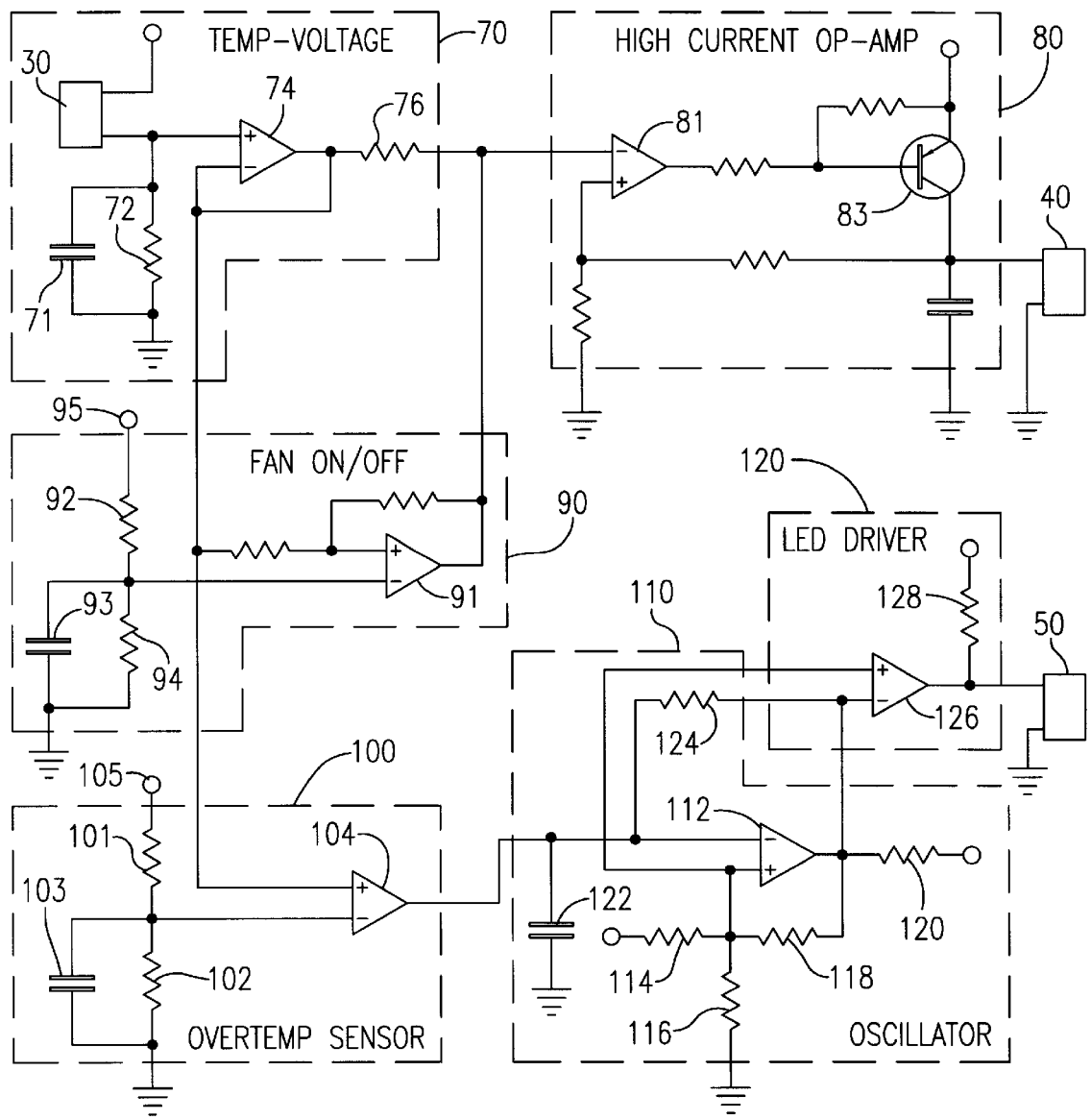
FIG. 2 is a schematic diagram for a control circuit for controlling the operation of a variable-speed fan for cooling an enclosure in accordance with the present invention.

Referring now to FIG. 2 there is illustrated a circuit for controlling the cooling operation of the enclosure of the present invention. The control circuit consists of six basic blocks: a temperature to voltage converter 70; a high current operational amplifier 80; a fan on/off control 90; an overtemperature sensor network 100; an oscillator 110; and an LED or alarm driver 120.

The temperature to voltage converter 70 includes a capacitor 71 in parallel with a resistor 72. The capacitor is provided for noise filtering purposes. The thermistor 30 is connected in series with capacitor 71 and resistor 72 to form a voltage divider. As will be appreciated by those skilled in the art, a thermistor is a variable-resistance device, the resistance of which varies as a function of temperature. Since the resistance of thermistor 30 varies inversely with temperature, as the temperature rises, the resistance of the thermistor decreases and the voltage at the function of the thermistor and the resistor 72 increases. The increased voltage at the thermistor/ resistor function provides a reference voltage for the rest of the circuit. This reference voltage varies as a function of the temperature within the enclosure 10.

As illustrated, the voltage divider formed by capacitor 71, resistor 72 and thermistor 30 is connected to an input of a voltage follower amplifier 74 that functions to increase the power level of the voltage at the voltage divider. In addition, the voltage follower amplifier 74 serves to buffer the small and variable output of the voltage divider, and to provide a current output applied to other circuit blocks of the circuit of FIG. 2.

The output from the voltage follower amplifier 74 is applied to a voltage comparator amplifier 91 in the fan on/off control 90. The fan on/off control includes a voltage divider formed from resistors 92 and 94 and capacitor 93. A voltage at terminal 95 establishes a set reference voltage at the function of the voltage divider. This set reference voltage represents the minimum temperature at which the fan 40 turns on. In one embodiment of the invention the set reference voltage represents a turn on temperature of 30° C. The voltage comparator amplifier 91 compares the reference voltage with the output from the voltage follower amplifier 74 to control operation of the fan 40. If the output of voltage follower amplifier 74 is below the reference voltage, the output of the comparator amplifier 91 is grounded. If the output of the voltage follower amplifier 74 is above the reference voltage, the comparator amplifier 91 will in effect appear as an open switch, allowing current to flow from the voltage follower amplifier 74 through an isolation resistor 76 to the high current operational amplifier 80. The isolation resistor 76 functions to isolate the output of the voltage follower amplifier 74 from the output of the comparator amplifier 91. The operation amplifier 80 comprises a conventional operational amplifier 81 having an output that controls a driver stage that uses transistor 83 to control the current to the fan 40 as a function of the output of voltage follower amplifier 74. Thus, as the temperature of the enclosure increases, the speed of the fan 40 increases, circulating more air through the enclosure 10.

The overtemperature sensor network 100 includes a voltage divider formed from resistors 101 and 102 and capacitor 103. A voltage at a terminal 105 is connected to the voltage divider to provide a constant reference voltage at the function of the divider, corresponding to a temperature of 60° C. The reference voltage is applied to a voltage comparator amplifier 104. The comparator amplifier 104 compares the reference voltage to the output of voltage follower amplifier 74. If the output of voltage follower amplifier 74 is below the reference voltage, the output of the comparator amplifier 104 is grounded. If the output of the voltage follower amplifier 74 is above the reference voltage at the divider function, the comparator amplifier 104 will in effect appear as an open switch. When the output of the comparator amplifier 104 appears as an open switch, the inputs to an oscillator amplifier 112 enable the oscillator 110 to commence oscillating.

In addition to the oscillator amplifier 112, the oscillator 110 includes a resistance network comprising resistors 114, 116, 118 and 121 where the resistors 114 and 121 are connected to voltage sources for establishing an oscillator reference voltage at the junction of the resistors 114, 116 and 118. This reference voltage is compared with the voltage across a capacitor 122 as charged through a resistor 124.

When the comparator amplifier 104 appears as an open switch, the capacitor 122 charges through the resistor 124. When the voltage across the capacitor 122 exceeds the reference voltage at the junction of the resistors 114 and 116 the oscillator amplifier 112 switches into an oscillating mode. The oscillating frequency of the oscillator amplifier 112 is determined by the capacitor 122 and the resistor 124.

In addition, when the capacitor 122 is charged to the reference voltage the output of the oscillator amplifier 112 goes high through the resistor 120 thereby driving the negative terminal of a driver amplifier 126 to go high with reference to the positive input terminal and the LED display 50 turns off. The second input to the driver amplifier 126 is the reference voltage established across the voltage divider of resistors 114 and 116. In addition to the driver amplifier 126 the LED driver 120 includes a current limiting resistor 128.

During normal operation of the enclosure 10 the oscillator amplifier 112 is inactive and the output of the driver amplifier 126 is held at ground potential and no current flows through the LED 50. As the oscillator amplifier 112 is driven into an oscillating mode as a result of an overtemperature condition, the output of the driver amplifier 126 oscillates between ground potential and the potential established by the current limiting resistor 128. The LED 50 then oscillates between an on/off state at the frequency of the oscillator 110.

The output from the oscillator in turn actuates the LED driver 120, causing the LED 50 to flash. In the embodiment illustrated, LED 50 is a bi-colored LED that, during normal operations is green. When an overtemperature condition occurs, the output from the oscillator causes the LED to cycle between green and red. Alternatively, an audible source could be provided in order to provide an audible alarm in the event of an overtemperature condition.

Figure 3:
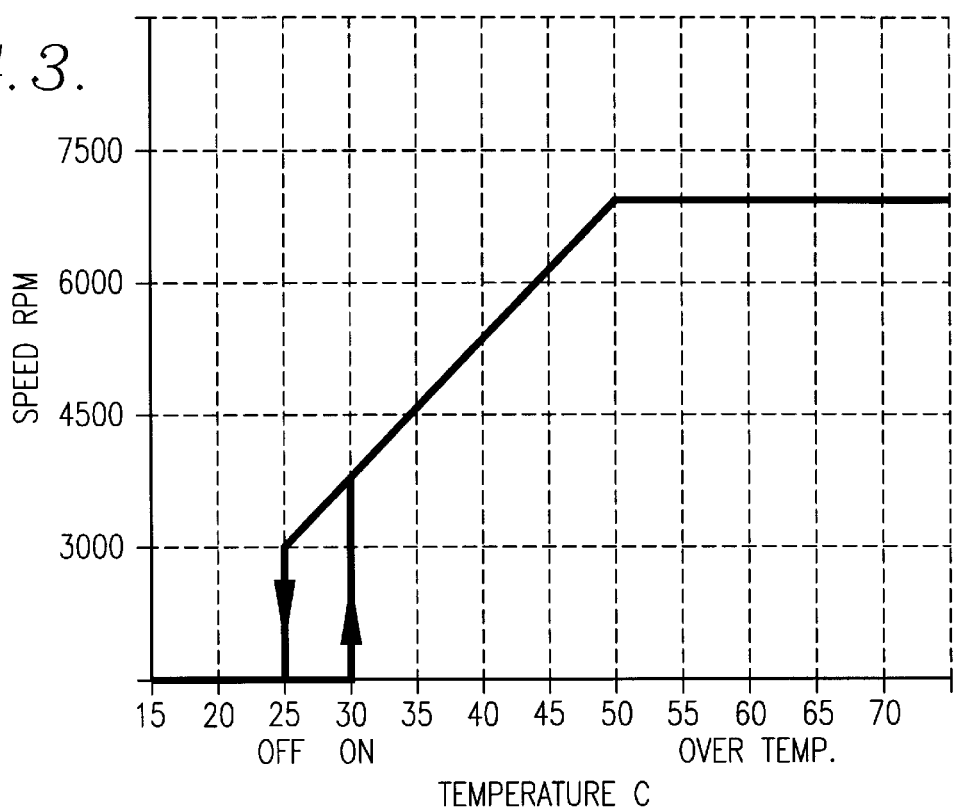
FIG. 3 is a graph generally illustrating the relationship between fan speed and enclosure temperature for an enclosure of the present invention.

Referring now to FIG. 3, there is presented a graphical representation of circulating fan speed versus temperature for an enclosure of the present invention. As illustrated, the fan remains off until thermistor 30 (FIG. 2) located in the enclosure, senses a temperature of approximately 30° C. as represented by the set reference voltage in the on/off control 90. As the temperature of the enclosure increases, as sensed by the thermistor 30, the on/off control 90 increases the speed of the fan 40, causing more air to circulate through the enclosure. When the temperature in the enclosure increases to a predetermined value, for example 60° C., the overtemp sensor 100 causes the LED to flash as described above thereby giving a visual indication to an operator of the over temperature condition.

Figure 4:
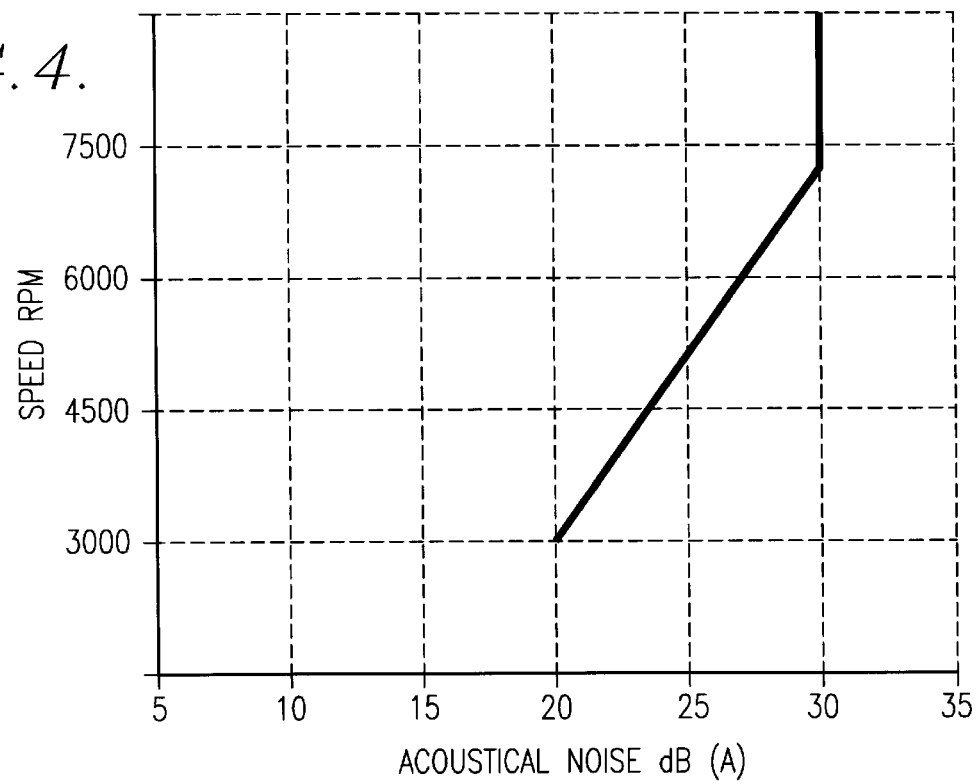
FIG. 4 is a graph generally illustrating the relationship between acoustical noise and fan speed for an enclosure of the present invention.

Turning now to FIG. 4, the effect of fan speed upon acoustical noise is illustrated. As is readily apparent, the generated acoustical noise varies with the operating speed of the circulating fan 40. Consequently, in order to minimize the amount of noise generated, it is desirable to maintain the fan speed at a level proportional to the cooling requirements of components in the enclosure. The present invention provides a control system for accomplishing this objective, as well as minimizing power consumption.

Although the present invention has been illustrated in the accompanying Drawings and described in the foregoing Detailed Description, it will be appreciated by those skilled in the art that various modifications and rearrangements of the component parts and elements of the present invention are possible without departing from the spirit and scope of the invention. The following claims are intended to cover all such modifications that are within the scope of the invention.

We claim:

1. A thermostatically controlled enclosure for a small computer device comprising:

a housing suitable for enclosing a small computer device;

a circulating fan mounted to the housing for circulating air through the housing;

a temperature sensor responsive to the temperature within the housing and outputting a signal varying with the housing inside temperature;

circuit means connected to said temperature sensor and to said circulating fan for varying the speed of the circulating fan as the temperature inside of the housing changes;

a light emitting diode having an on state and an off state; and an oscillator circuit having a frequency of oscillation connected to said light emitting diode and said temperature sensor for alternately energizing and deenergizing said light emitting diode, thereby causing said light emitting diode to operate between said on state and said off state at said oscillator circuit frequency to thereby generate a flashing display when the temperature within the housing reaches a predetermined temperature.

2. The enclosure of claim 1 wherein said light emitting diode off state displays a first color and said light emitting diode on state displays a second color.

* * * * *